US 8,642,446 B2

(12) United States Patent
Lin et al.

(10) Patent No.: US 8,642,446 B2
(45) Date of Patent: Feb. 4, 2014

(54) SEMICONDUCTOR DEVICE AND METHOD OF FORMING PROTECTIVE STRUCTURE AROUND SEMICONDUCTOR DIE FOR LOCALIZED PLANARIZATION OF INSULATING LAYER

(75) Inventors: Yaojian Lin, Singapore (SG); Xia Feng, Singapore (SG); Kang Chen, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 378 days.

(21) Appl. No.: 12/891,232

(22) Filed: Sep. 27, 2010

(65) Prior Publication Data

US 2012/0074534 A1    Mar. 29, 2012

(51) Int. Cl.
*H01L 21/00* (2006.01)

(52) U.S. Cl.
USPC ........... 438/462; 438/465; 438/778; 257/632; 257/E21.589; 257/E23.002

(58) Field of Classification Search
USPC .......... 438/462, 778, 465; 257/632, E21.589, 257/E23.002
See application file for complete search history.

(56) References Cited

U.S. PATENT DOCUMENTS

| 4,651,409 | A | * | 3/1987 | Ellsworth et al. | 438/207 |
| 5,895,226 | A | * | 4/1999 | Baba et al. | 438/68 |
| 6,284,573 | B1 | * | 9/2001 | Farnworth | 438/114 |
| 6,410,406 | B1 | * | 6/2002 | Farnworth et al. | 438/462 |
| 6,593,171 | B2 | * | 7/2003 | Farnworth | 438/127 |
| 2012/0018874 | A1 | * | 1/2012 | Lin et al. | 257/734 |

* cited by examiner

*Primary Examiner* — Stephen W Smoot
*Assistant Examiner* — Vicki B Booker
(74) *Attorney, Agent, or Firm* — Robert D. Atkins; Patent Law Group: Atkins & Associates, P.C.

(57) ABSTRACT

A semiconductor wafer contains a plurality of semiconductor die separated by a saw street. A contact pad is formed over an active surface of the semiconductor die. A protective pattern is formed over the active surface of the semiconductor die between the contact pad and saw street of the semiconductor die. The protective pattern includes a segmented metal layer or plurality of parallel segmented metal layers. An insulating layer is formed over the active surface, contact pad, and protective pattern. A portion of the insulating layer is removed to expose the contact pad. The protective pattern reduces erosion of the insulating layer between the contact pad and saw street of the semiconductor die. The protective pattern can be angled at corners of the semiconductor die or follow a contour of the contact pad. The protective pattern can be formed at corners of the semiconductor die.

26 Claims, 7 Drawing Sheets

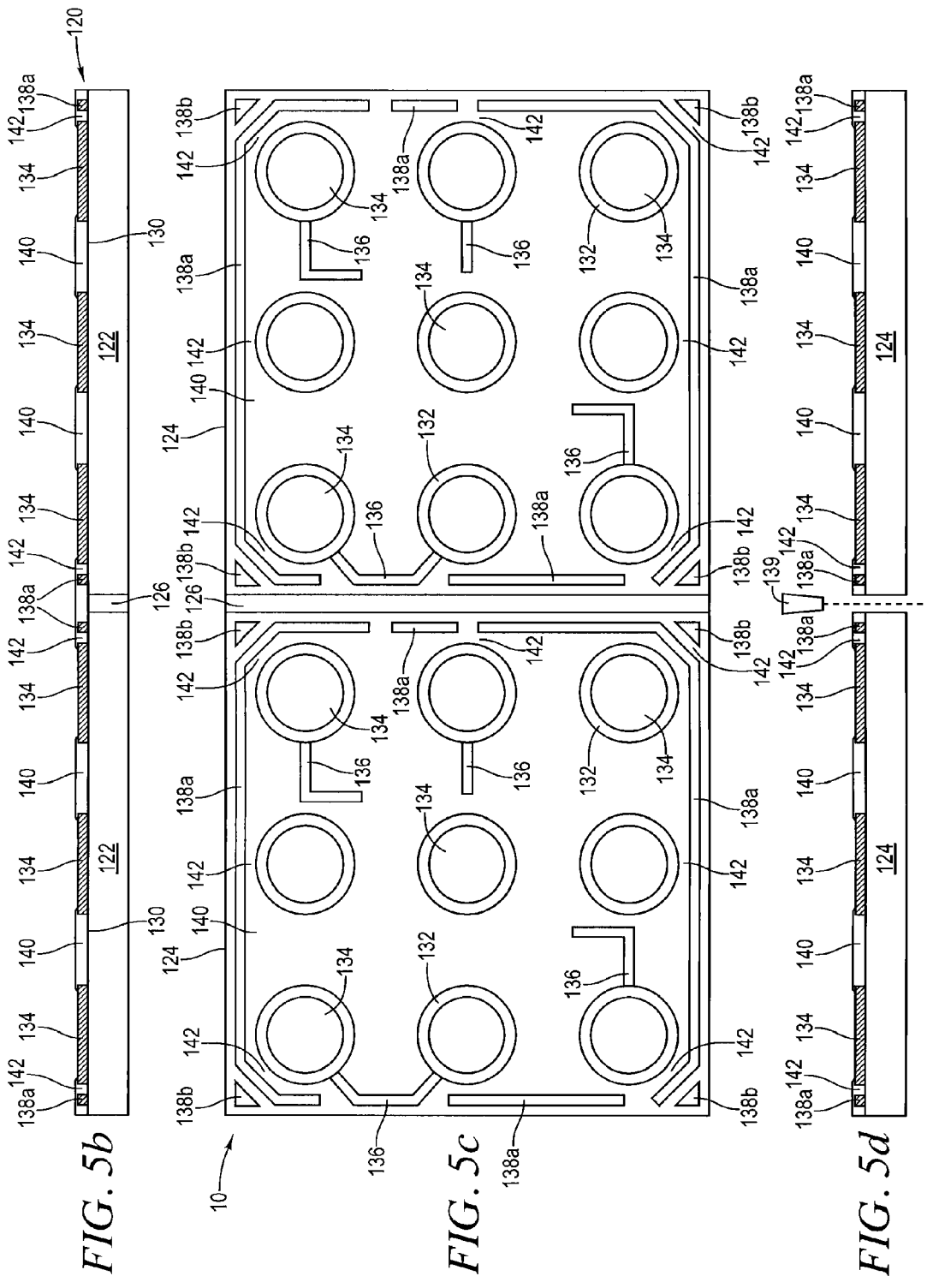

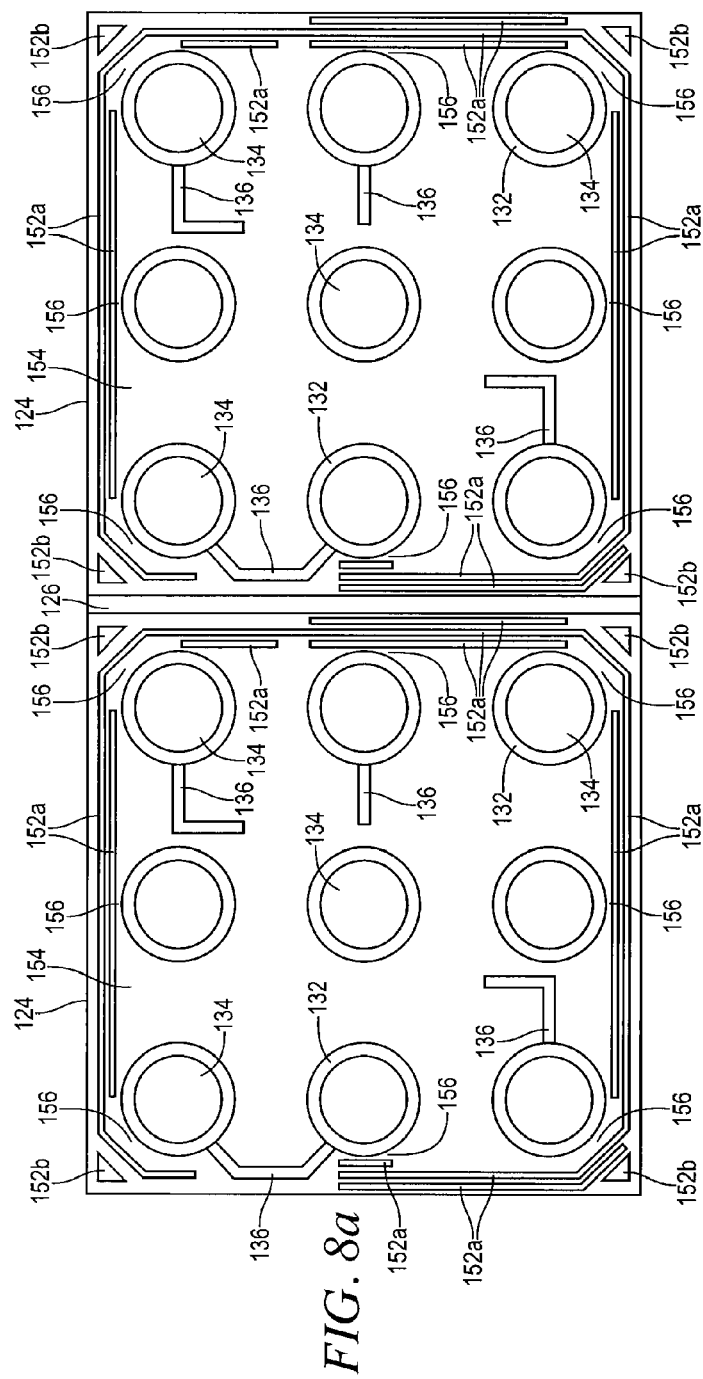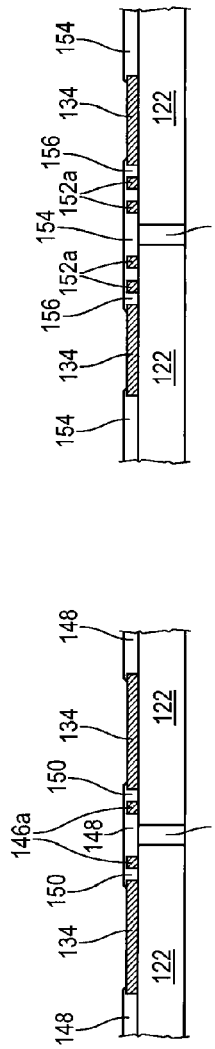

US 8,642,446 B2

SEMICONDUCTOR DEVICE AND METHOD OF FORMING PROTECTIVE STRUCTURE AROUND SEMICONDUCTOR DIE FOR LOCALIZED PLANARIZATION OF INSULATING LAYER

FIELD OF THE INVENTION

The present invention relates in general to semiconductor devices and, more particularly, to a semiconductor device and method of forming a protective structure around a semiconductor die for localized planarization of an insulating layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a portion of a conventional semiconductor wafer 10 with a plurality of semiconductor die 12 separated by saw street 14. Contact pads 16 are formed over the active surface of semiconductor die 12. A passivation layer 18 is formed over the active surface and contact pads 16. A portion of passivation layer 18 is removed to expose contact pads 16 for electrical interconnect. However, passivation layer 18 can erode and become undesirably thin, particularly at the edges and corners of semiconductor die 12 and semiconductor wafer 10, during the developing process. FIG. 2 shows the erosion of passivation layer 18 at corner or edge 20 of wafer 10 or semiconductor die 12. The thin passivation layer 18 can cause defects and reduce reliability of semiconductor die 12 in its final package configuration.

SUMMARY OF THE INVENTION

A need exists for reduced erosion of the passivation layer over an active surface of a semiconductor die. Accordingly, in one embodiment, the present invention is a method of making a semiconductor device comprising the steps of providing a semiconductor wafer with a plurality of semiconductor die separated by a saw street, forming a contact pad over an active surface of the semiconductor die, forming a protective pattern over the active surface of the semiconductor die between the contact pad and saw street of the semiconductor die, forming an insulating layer over the active surface, contact pad, and protective pattern, and removing a portion of the insulating layer to expose the contact pad. The protective pattern reduces erosion of the insulating layer between the contact pad and saw street of the semiconductor die.

In another embodiment, the present invention is a method of making a semiconductor device comprising the steps of providing a semiconductor wafer, forming a conductive layer over a surface of the semiconductor wafer, forming a protective pattern over the surface of the semiconductor wafer between the conductive layer and an edge of the semiconductor wafer, forming an insulating layer over the surface of the semiconductor wafer, conductive layer, and protective pattern, and removing a portion of the insulating layer to expose a portion of the conductive layer. The protective pattern maintains the insulating layer between the conductive layer and edge of the semiconductor wafer.

In another embodiment, the present invention is a method of making a semiconductor device comprising the steps of providing a semiconductor die, forming a conductive layer over a surface of the semiconductor die, forming a protective pattern over the surface of the semiconductor die adjacent to the conductive layer, and forming an insulating layer over the surface of the semiconductor die, conductive layer, and protective pattern. The protective pattern maintains the insulating layer adjacent to the conductive layer.

In another embodiment, the present invention is a semiconductor device comprising a semiconductor die and conductive layer formed over a surface of the semiconductor die. A protective pattern is formed over the surface of the semiconductor wafer adjacent to the conductive layer. An insulating layer is formed over the surface of the semiconductor die, conductive layer, and protective pattern. The protective pattern maintains the insulating layer adjacent to the conductive layer.

BRIEF DESCRIPTION OF THE DRAWINGS

FIGS. 5a-5d illustrate a process of forming a protective pattern around a semiconductor die for localized planarization of an insulating layer;

FIGS. 7a-7b illustrate a protective pattern following a contour of the contact pads for localized planarization of an insulating layer;

FIGS. 8a-8b illustrate a protective pattern of parallel segments for localized planarization of an insulating layer;

DETAILED DESCRIPTION OF THE DRAWINGS

Figure 1:
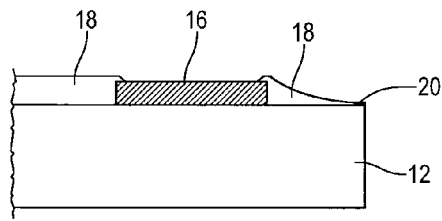
FIG. 1 illustrates a conventional semiconductor wafer with a passivation layer formed over the semiconductor die.
Figure 2:
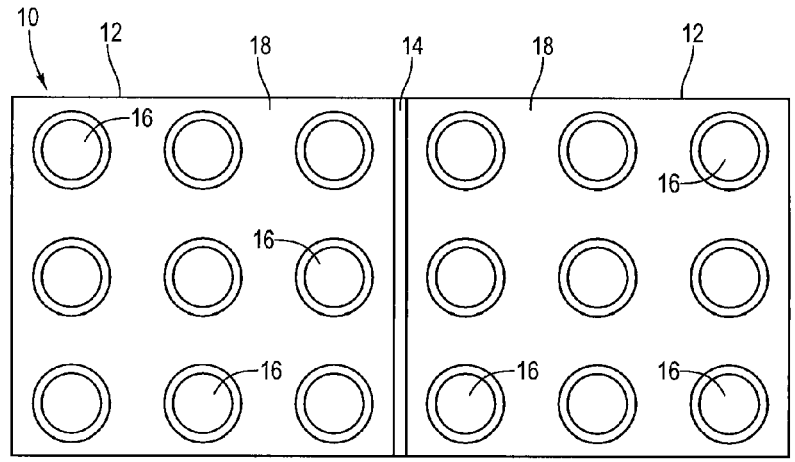
FIG. 2 illustrates an edge of the conventional semiconductor wafer with erosion of the passivation layer.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
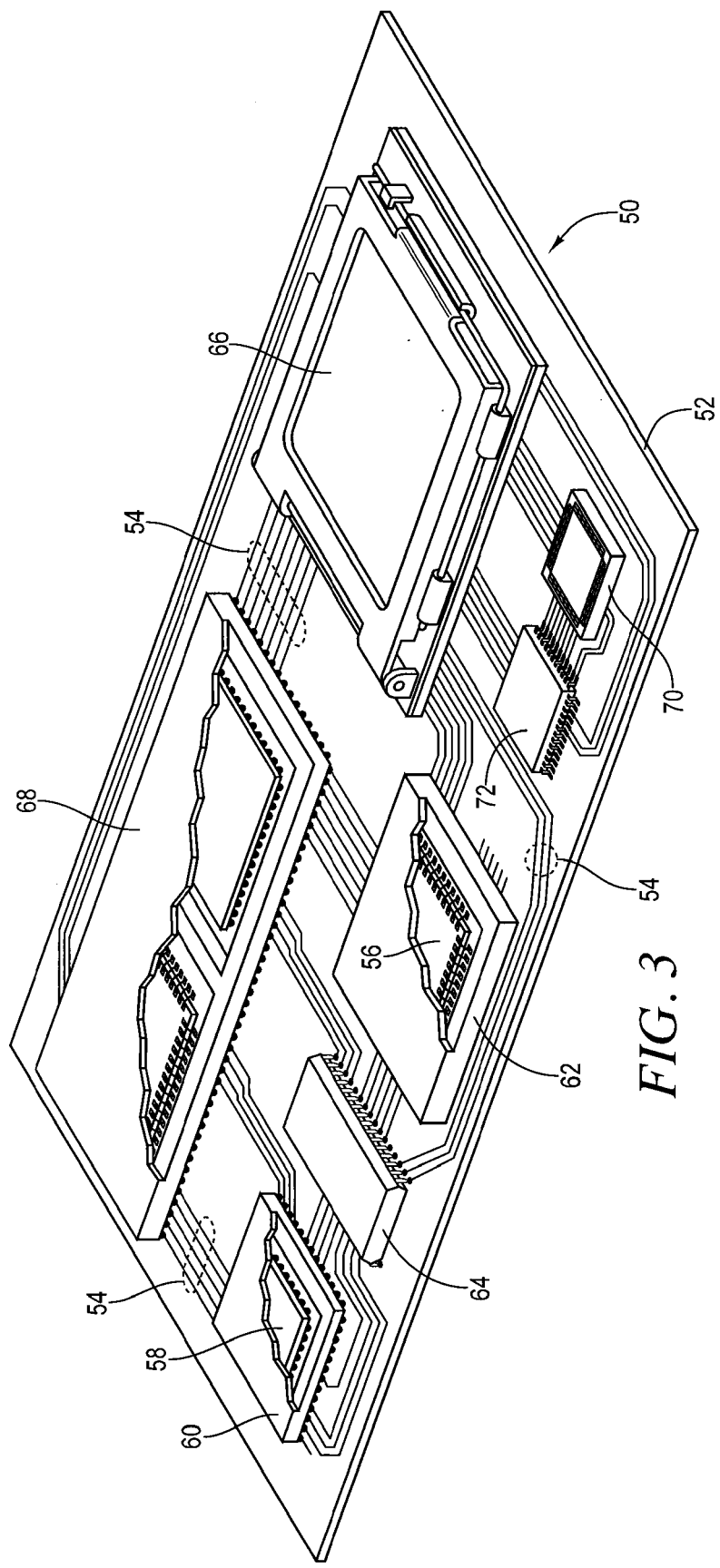
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
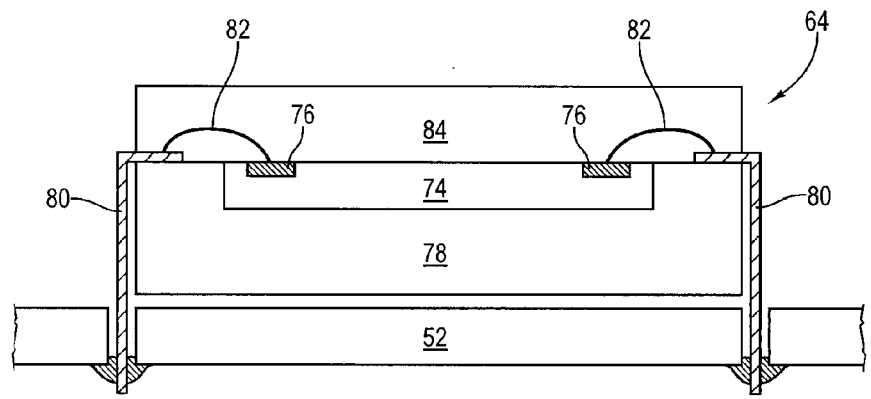
FIGS. 4a-4c illustrate further detail of the representative semiconductor packages mounted to the PCB.
Figure 4B:
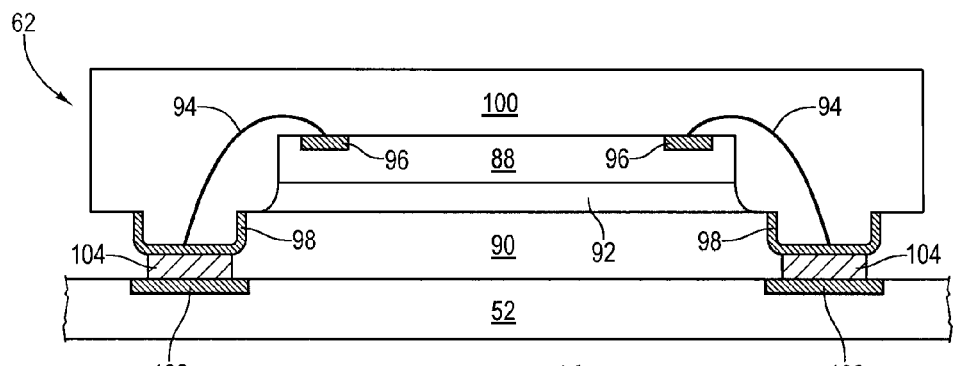
Figure 4C:
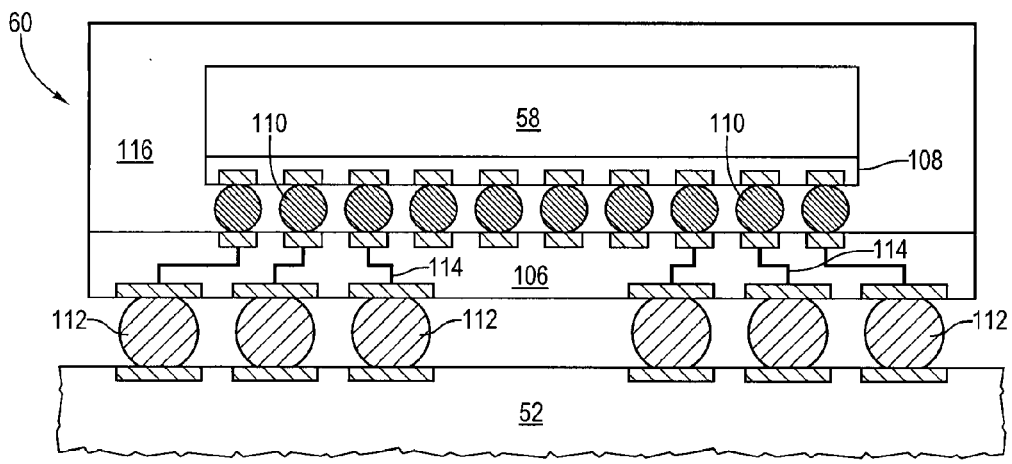

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5A:
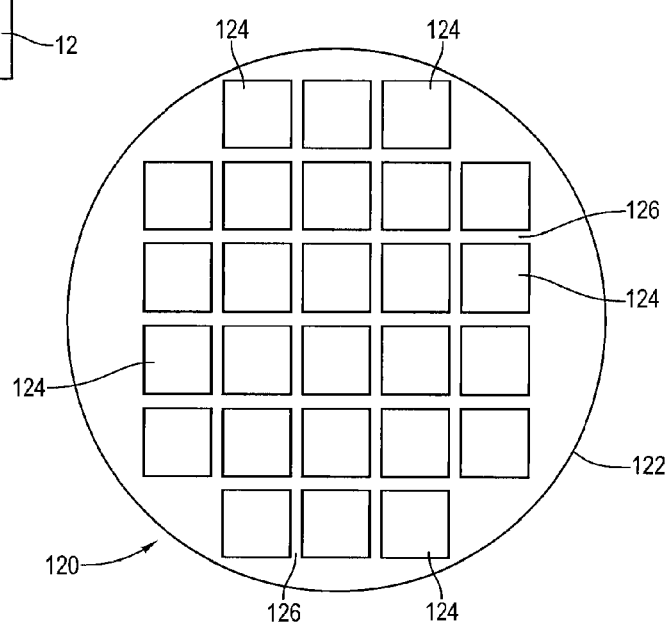

FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

FIG. 5b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 and redistribution dielectric passivation layer, using PVD, CVD, electrolytic plating, electroless plating process, or other suitable metal deposition process. Conductive layer 132 can be one or more layers of Al, Cu, Sn, Ni, Au, Ag, or other suitable electrically conductive material. A portion of conductive layer 132 operates as contact pads 134 electrically connected to the circuits on active surface 130, and to the next level package interconnection, for example forming bumps on contact pads 134.

FIG. 5c shows a plan view of a portion of semiconductor wafer 120 constituting two adjacent semiconductor die 124. Contact pads 134 can be formed around a perimeter of semiconductor die 124, and interior to the semiconductor die. Another portion of conductive layer 132 provides signal trace lines 136 formed over active surface 130 and electrically connected to contact pads 134 for signal routing to the circuits on the active surface.

A protective and planarization metal pattern 138 is formed over active surface 130 using patterning and PVD, CVD, electrolytic plating, electroless plating process, or other suitable metal deposition process. More specifically, protective layer 138 is formed along the edges of each semiconductor die 124, i.e., along or partially over saw streets 126, adjacent to perimeter contact pads 134 adjacent to perimeter contact pads 134 to planarize passivation layer 140 around the edge or corner pads 134 and balance the stress distribution over the pads in order to improve the reliability. Protective layer 138 can be one or more layers of Al, Cu, Sn, Ni, Au, Ag, or other suitable material. Protective pattern 138 is patterned and deposited during the same process sequence as conductive layer 132. Protective pattern 138 is electrically isolated from contact pads 134 and trace lines 136 and the circuits on active surface 130.

In one embodiment, protective pattern 138a is a generally straight, dummy metal trace pattern around a perimeter of semiconductor die 124, outside and adjacent to perimeter contact pads 134, with angles around the corners of the semiconductor die. The straight trace pattern of protective pattern 138a can be broken or segmented as needed to avoid electrical contact with signal trace lines 136 or other electrically sensitive areas of active surface 130. In addition, protective pattern 138b is disposed at the corners of semiconductor die 124 in a polygon or rounded shape, e.g., a triangle shape to follow the angles of protective pattern 138a.

An insulating or passivation layer 140 is formed over active surface 130, conductive layer 132, and protective pattern 138 using PVD, CVD, printing, spin coating, spray coating, lamination, or thermal oxidation. The insulating layer 140 can be one or more layers of silicon dioxide (SiO2), silicon nitride (Si3N4), silicon oxynitride (SiON), tantalum pentoxide (Ta2O5), aluminum oxide (Al2O3), polymer dielectric, such as polyimide, PBO, WPR, polymer based lower temperature curing polymer, solder mask, or other suitable material with similar insulating and structural properties. A portion of insulating layer 140 is removed by an etching process to expose contact pads 134.

Protective pattern 138 provides improved local planarization of insulating layer 140 around the edges of semiconductor die 124, e.g., in areas 142. That is, protective pattern 138 reduces erosion and maintains the thickness of insulating layer 140 during developing so that insulating layer 140 in areas 142 has substantially the same thickness as in the interior portions of semiconductor die 124. The insulating layer 140 in areas 142 resists erosion during developing after exposure due to the support of protective pattern 138a and 138b. In addition, protective pattern 138 aids with orientation recognition of semiconductor die 124, as well as localized stress relief.

Figure 6:
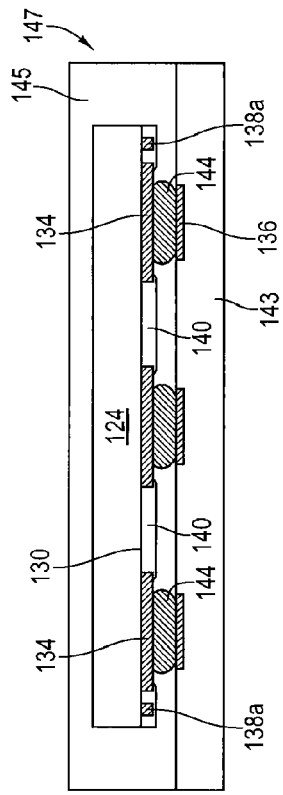
FIG. 6 illustrates the semiconductor die with the protective pattern mounted to a substrate in a WLCSP.

In FIG. 5d, semiconductor wafer 120 is singulated through saw street 126 using saw blade or laser cutting tool 139 into individual semiconductor die 124. Semiconductor die 124 can be mounted to a substrate or stacked in any package configuration. For example, FIG. 6 shows semiconductor die 124 mounted to substrate 143 with bumps 144 and covered by encapsulant 145 in wafer level chip scale package (WLCSP) 147. Protective pattern 138 maintains an even thickness and coverage of insulating layer 140 up to and including the edge of semiconductor die 124.

Figure 7A:
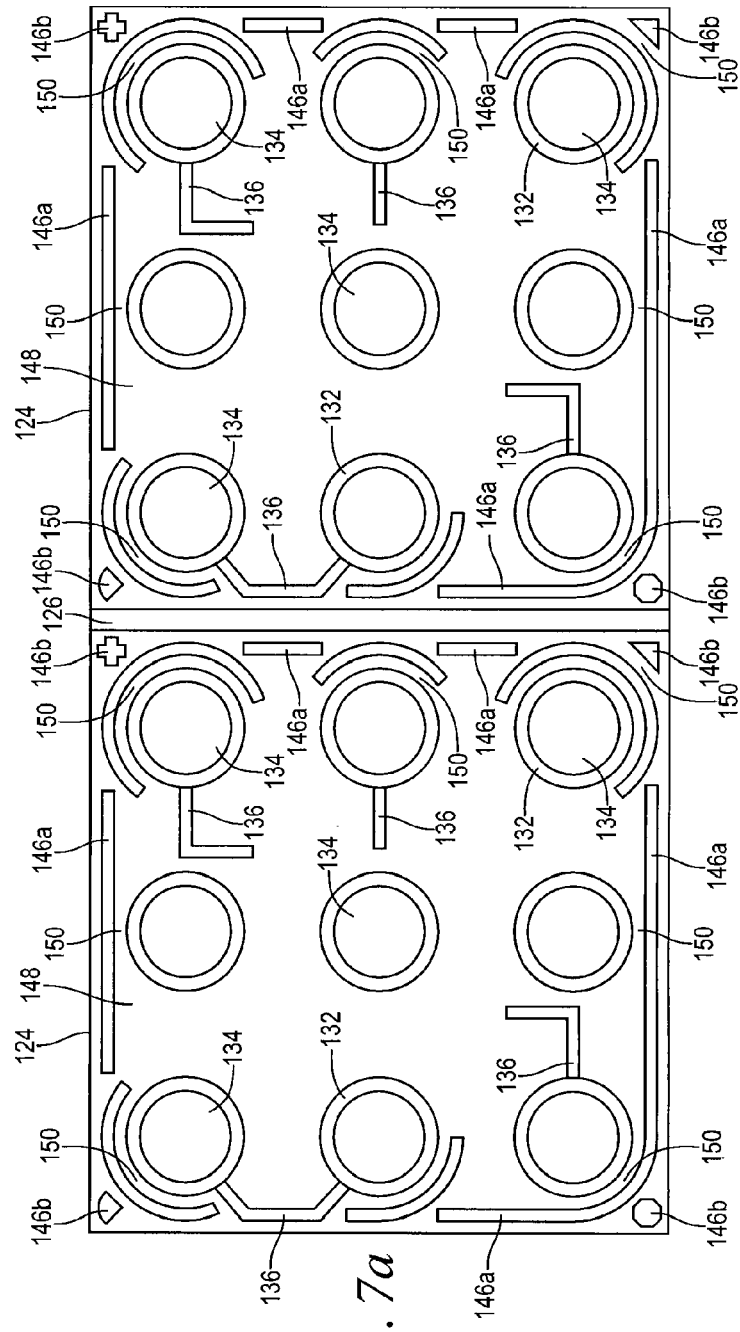

FIG. 7a is a plan view of another embodiment of the protective pattern, continuing from FIG. 5b, with electrically conductive layer 132 formed over active surface 130 as contact pads 134 and signal traces 136. A protective pattern 146 is formed over active surface 130 using patterning and PVD, CVD, electrolytic plating, electroless plating process, or other suitable metal deposition process. More specifically, protective pattern 146 is formed along the edges of each semiconductor die 124, i.e., along or partially over saw streets 126, as well as along the edge of semiconductor wafer 120, adjacent to perimeter contact pads 134. Protective pattern 146 can be one or more layers of Al, Cu, Sn, Ni, Au, Ag, or other suitable material. Protective pattern 146 can be patterned and deposited during the same process sequence as conductive layer 132. Protective pattern 146 is electrically isolated from contact pads 134 and trace lines 136 and the circuits on active surface 130.

In this case, protective pattern 146a is a dummy metal trace pattern around a perimeter of semiconductor die 124, outside and adjacent to perimeter contact pads 134. Protective pattern 146a follows the contour of contact pads 134. For example, protective pattern 146a is rounded around circular contact pads 134. The trace pattern of protective pattern 146a can be broken or segmented as needed to avoid electrical contact with signal trace lines 136 or other electrically sensitive areas of active surface 130. In addition, protective pattern 146b is disposed at the corners of semiconductor die 124 in any regular or irregular shape, e.g., cross, diamond, or polygon shape.

An insulating or passivation layer 148 is formed over active surface 130, conductive layer 132, and protective pattern 146 using PVD, CVD, printing, spin coating, spray coating, or thermal oxidation. The insulating layer 140 can be one or more layers of SiO2, Si3N4, SiON, Ta2O5, Al2O3, or other suitable material with similar insulating and structural properties. A portion of insulating layer 148 is removed by an etching process to expose contact pads 134.

Protective pattern 146 provides improved local planarization of insulating layer 140 around the edges of semiconductor die 124, e.g., in areas 150, as shown in FIG. 7b. That is, protective pattern 146 reduces erosion and maintains the thickness of insulating layer 148 during developing so that insulating layer 148 in areas 150 has substantially the same thickness as in the interior portions of semiconductor die 124. The insulating layer 148 in areas 150 resists erosion during developing after exposure due to the support of protective pattern 146a and 146b. In addition, protective pattern 146 aids with orientation recognition of semiconductor die 124, as well as localized stress relief.

FIG. 8a is a plan view of another embodiment of the protective pattern, continuing from FIG. 5b, with electrically conductive layer 132 formed over active surface 130 as contact pads 134 and signal traces 136. A protective pattern 152 is formed over active surface 130 using patterning and PVD, CVD, electrolytic plating, electroless plating process, or other suitable metal deposition process. More specifically, protective pattern 152 is formed along the edges of each semiconductor die 124, i.e., along or partially over saw streets 126, as well as along the edge of semiconductor wafer 120, adjacent to perimeter contact pads 134. Protective pattern 152 can be one or more layers of Al, Cu, Sn, Ni, Au, Ag, or other suitable material. Protective pattern 152 can be patterned and deposited during the same process sequence as conductive layer 132. Protective pattern 152 is electrically isolated from contact pads 134 and trace lines 136 and the circuits on active surface 130.

In this case, protective pattern 152a is a plurality of straight, parallel dummy metal trace patterns around a perimeter of semiconductor die 124, outside and adjacent to perimeter contact pads 134, with angles around the corners of the semiconductor die. The straight, parallel trace pattern of protective pattern 152a can be broken or segmented as needed to avoid electrical contact with signal trace lines 136 or other electrically sensitive areas of active surface 130. In addition, protective pattern 152b is disposed at the corners of semiconductor die 124 in a polygon or rounded shape, e.g., triangle shape to follow the angles of protective pattern 152a.

An insulating or passivation layer 154 is formed over active surface 130, conductive layer 132, and protective pattern 152 using PVD, CVD, printing, spin coating, spray coating, or thermal oxidation. The insulating layer 154 can be one or more layers of SiO2, Si3N4, SiON, Ta2O5, Al2O3, or other suitable material with similar insulating and structural properties. A portion of insulating layer 154 is removed by an etching process to expose contact pads 134.

Protective pattern 152 provides improved local planarization of insulating layer 154 around the edges of semiconductor die 124, e.g., in areas 156, as shown in FIG. 8b. That is, protective pattern 152 reduces erosion and maintains the thickness of insulating layer 154 during developing so that insulating layer 154 in areas 156 has substantially the same thickness as in the interior portions of semiconductor die 124. The insulating layer 154 in areas 156 resists erosion during developing after exposure due to the support of protective pattern 152a and 152b. In addition, protective pattern 152 aids with orientation recognition of semiconductor die 124, as well as localized stress relief.

Figure 9:
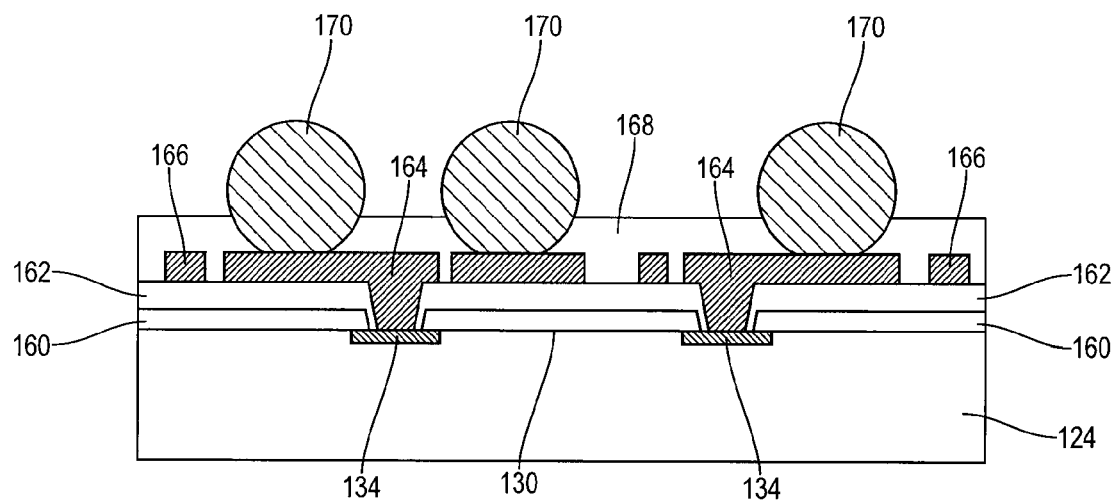
FIG. 9 illustrates the protective pattern formed over a re-routing passivation layer in a WLCSP with an RDL.

FIG. 9 shows another embodiment with an insulating or passivation layer 160 formed over active surface 130 and conductive layer 132 of semiconductor die 124 using PVD, CVD, printing, spin coating, spray coating, or thermal oxidation. The insulating layer 160 can be one or more layers of SiO2, Si3N4, SiON, Ta2O5, Al2O3, or other suitable material with similar insulating and structural properties. A portion of insulating layer 160 is removed by an etching process to expose contact pads 134.

An insulating or passivation layer 162 is formed over insulating layer 160 and the exposed contact pads 134 using PVD, CVD, printing, spin coating, spray coating, or thermal oxidation. The insulating layer 162 can be one or more layers of SiO2, Si3N4, SiON, Ta2O5, Al2O3, or other suitable material with similar insulating and structural properties. A portion of insulating layer 162 is removed by an etching process to expose contact pads 134.

An electrically conductive layer or RDL 164 is formed over insulating layer 162 and contact pads 134. A protective pattern 166 is formed over insulating layer 162 using patterning and PVD, CVD, electrolytic plating, electroless plating process, or other suitable metal deposition process. Protective pattern 166 can be one or more layers of Al, Cu, Sn, Ni, Au, Ag, or other suitable material. Protective pattern 166 can be patterned and deposited during the same process sequence as conductive layer 164. Protective pattern 166 is electrically isolated from conductive layer 164.

An insulating or passivation layer 168 is formed over insulating layer 162 and conductive layer 164, and protective pattern 166 using PVD, CVD, printing, spin coating, spray coating, or thermal oxidation. The insulating layer 168 can be one or more layers of SiO2, Si3N4, SiON, Ta2O5, Al2O3, or other suitable material with similar insulating and structural properties. A portion of insulating layer 168 is removed by an etching process to expose conductive layer 164. Bumps 170 are formed over the exposed conductive layer 164. The insulating layer 168 may have a designated opening to define the saw street.

Protective pattern 166 provides improved local planarization of insulating layer 168. That is, protective pattern 166 reduces erosion and maintains the thickness of insulating layer 168 during developing due to the support of the protective pattern.

Figure 10:
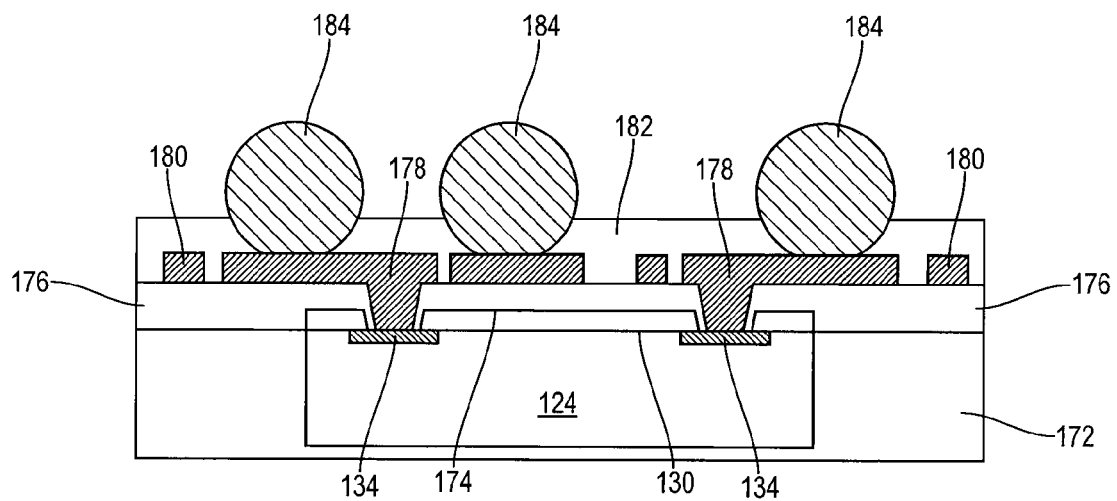
FIG. 10 illustrates the protective pattern formed over the re-routing passivation layer in a Fo-WLCSP with an RDL.

FIG. 10 shows another embodiment with an encapsulant 172 formed over semiconductor die 124 as a substrate of a fan-out wafer level chip scale package (Fo-WLCSP). An insulating or passivation layer 174 formed over active surface 130 and conductive layer 132 of semiconductor die 124 using PVD, CVD, printing, spin coating, spray coating, or thermal oxidation. The insulating layer 174 can be one or more layers of SiO2, Si3N4, SiON, Ta2O5, Al2O3, or other suitable material with similar insulating and structural properties. A portion of insulating layer 174 is removed by an etching process to expose contact pads 134.

An insulating or passivation layer 176 is formed over insulating layer 174 and the exposed contact pads 134 using PVD, CVD, printing, spin coating, spray coating, or thermal oxidation. The insulating layer 176 can be one or more layers of SiO2, Si3N4, SiON, Ta2O5, Al2O3, or other suitable material with similar insulating and structural properties. A portion of insulating layer 176 is removed by an etching process to expose contact pads 134.

An electrically conductive layer or RDL 178 is formed over insulating layer 176 and contact pads 134. A protective pattern 180 is formed over insulating layer 176 using patterning and PVD, CVD, electrolytic plating, electroless plating process, or other suitable metal deposition process. Protective pattern 180 can be one or more layers of Al, Cu, Sn, Ni, Au, Ag, or other suitable material. Protective pattern 180 can be patterned and deposited during the same process sequence as conductive layer 178. Protective pattern 180 is electrically isolated from conductive layer 178.

An insulating or passivation layer 182 is formed over insulating layer 176 and conductive layer 178, and protective pattern 180 using PVD, CVD, printing, spin coating, spray coating, or thermal oxidation. The insulating layer 182 can be one or more layers of SiO2, Si3N4, SiON, Ta2O5, Al2O3, or other suitable material with similar insulating and structural properties. A portion of insulating layer 182 is removed by an etching process to expose conductive layer 178. Bumps 184 are formed over the exposed conductive layer 178.

Protective pattern 180 provides improved local planarization of insulating layer 182. That is, protective pattern 180 reduces erosion and maintains the thickness of insulating layer 182 during developing due to the support of the protective pattern.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
 providing a semiconductor wafer with a plurality of semiconductor die separated by a saw street;
 forming a contact pad over a surface of each of the semiconductor die;
 forming a protective pattern over the surface of the semiconductor die between the contact pad and saw street of the semiconductor die;
 forming a first insulating layer over the surface, contact pad, and protective pattern; and
 removing a portion of the first insulating layer to expose the contact pad, wherein the protective pattern reduces erosion of the first insulating layer between the contact pad and saw street of the semiconductor die.

2. The method of claim 1, wherein the protective pattern includes a metal layer.

3. The method of claim 1, wherein the protective pattern is segmented.

4. The method of claim 1, further including forming a second insulating layer over the surface of the semiconductor die with an opening to the contact pad.

5. The method of claim 1, wherein the protective pattern follows a contour of the contact pad.

6. The method of claim 1, wherein the protective pattern includes a plurality of parallel segments.

7. The method of claim 1, further including forming the protective pattern at corners of the semiconductor die.

8. A method of making a semiconductor device, comprising:
 providing a semiconductor wafer;
 forming a conductive layer over a surface of the semiconductor wafer;
 forming a protective pattern over the surface of the semiconductor wafer between the conductive layer and an edge of the semiconductor wafer, wherein the protective pattern includes a metal layer; and
 forming an insulating layer over the surface of the semiconductor wafer, conductive layer, and protective pattern, wherein the protective pattern maintains the insulating layer between the conductive layer and edge of the semiconductor wafer.

9. The method of claim 8, wherein the protective pattern is segmented.

10. The method of claim 8, wherein the protective pattern follows a contour of the conductive layer.

11. The method of claim 8, wherein the protective pattern includes a plurality of parallel segments.

12. The method of claim 8, further including forming the protective pattern at corners of the semiconductor wafer.

13. A method of making a semiconductor device, comprising:
 providing a semiconductor die;
 forming a conductive layer over a surface of the semiconductor die;
 forming a protective pattern over the surface of the semiconductor die separated from the conductive layer; and
 forming a first insulating layer in contact with the surface of the semiconductor die, conductive layer, and protective pattern, wherein the protective pattern maintains the first insulating layer adjacent to the conductive layer.

14. The method of claim 13, further including removing a portion of the first insulating layer to expose a portion of the conductive layer, wherein the protective pattern reduces erosion of the first insulating layer adjacent to the conductive layer.

15. The method of claim 13, wherein the protective pattern includes a metal layer.

16. The method of claim 13, wherein the protective pattern is segmented.

17. The method of claim 13, further including forming an encapsulant over the semiconductor die.

18. The method of claim 13, further including forming a second insulating layer over the surface of the semiconductor die with an opening to the conductive layer.

19. The method of claim 13, further including forming the protective pattern at corners of the semiconductor die.

20. A method of making a semiconductor device, comprising:
 providing a semiconductor die;
 forming a conductive layer over a surface of the semiconductor die;
 forming a protective pattern over the surface of the semiconductor die separated from the conductive layer; and
 forming a first insulating layer over the surface of the semiconductor die, conductive layer, and protective pattern, wherein the protective pattern maintains the first insulating layer between the conductive layer and protective pattern.

21. The method of claim 20, further including removing a portion of the first insulating layer to expose a portion of the conductive layer, wherein the protective pattern reduces erosion of the first insulating layer adjacent to the conductive layer.

22. The method of claim 20, wherein the protective pattern includes a metal layer.

23. The method of claim 20, wherein the protective pattern is segmented.

24. The method of claim 20, further including forming an encapsulant over the semiconductor die.

25. The method of claim 20, further including forming a second insulating layer over the surface of the semiconductor die with an opening to the conductive layer.

26. The method of claim 20, further including forming the protective pattern at corners of the semiconductor die.

* * * * *